US006676990B1

(12) United States Patent
Hatwar et al.

(10) Patent No.: US 6,676,990 B1
(45) Date of Patent: Jan. 13, 2004

(54) METHOD OF DEPOSITING ALUMINUM-LITHIUM ALLOY CATHODE IN ORGANIC LIGHT EMITTING DEVICES

(75) Inventors: Tukaram K. Hatwar, Penfield, NY (US); Gopalan Rajeswaran, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 357 days.

(21) Appl. No.: 09/627,204

(22) Filed: Jul. 27, 2000

(51) Int. Cl.$^7$ ................................................. B05D 5/12
(52) U.S. Cl. ......................................... 427/66; 118/726
(58) Field of Search .............................. 427/66; 118/726

(56) References Cited

U.S. PATENT DOCUMENTS

| | | | | |
|---|---|---|---|---|
| 3,710,352 A | * | 1/1973 | Smith et al. ................ 365/117 |
| 3,756,193 A | * | 9/1973 | Carmichael et al. ........ 118/726 |
| 4,356,429 A | | 10/1982 | Tang |
| 4,539,507 A | | 9/1985 | VanSlyke et al. |
| 4,720,432 A | | 1/1988 | VanSlyke et al. |
| 4,781,756 A | * | 11/1988 | Frianeza-Kullberg et al. 75/745 |
| 4,885,211 A | | 12/1989 | Tang et al. |
| 4,950,950 A | | 8/1990 | Perry et al. |
| 5,047,687 A | | 9/1991 | VanSlyke |
| 5,059,062 A | | 10/1991 | Bresnahan |
| 5,059,861 A | | 10/1991 | Littman et al. |
| 5,059,862 A | | 10/1991 | VanSlyke et al. |
| 5,061,569 A | | 10/1991 | VanSlyke et al. |
| 5,073,446 A | | 12/1991 | Scozzafava et al. |
| 5,141,671 A | | 8/1992 | Bryan et al. |
| 5,150,006 A | | 9/1992 | Van Slyke et al. |
| 5,151,629 A | | 9/1992 | VanSlyke |
| 5,622,564 A | * | 4/1997 | Vignola et al. ............. 118/715 |
| 5,674,635 A | * | 10/1997 | Hsieh et al. ................. 313/502 |
| 5,712,442 A | * | 1/1998 | Lee et al. ......................... 89/8 |
| 5,776,622 A | | 7/1998 | Hung et al. |
| 5,902,688 A | * | 5/1999 | Antoniadis et al. ......... 313/505 |
| 6,064,151 A | * | 5/2000 | Choong et al. ............. 313/504 |
| 6,106,933 A | * | 8/2000 | Nagai et al. ........... 427/255.31 |

OTHER PUBLICATIONS

"Organic EL Cells Using Alkaline Metal Compounds as Electron Injection Materials", by Takeo Wakimoto et al., IEEE Transactions on Electron Devices, vol. 44, No. 8, Aug. 1997.

"Advanced Resistance Deposition Technology for Productive Roll Coating" by I. Baxter, Society of Vacuum Coasters, the Annual Technical Conference Proceedings 197 (1993). (None).

* cited by examiner

*Primary Examiner*—Shrive P. Beck
*Assistant Examiner*—Michael Cleveland
(74) *Attorney, Agent, or Firm*—Raymond L. Owens

(57) ABSTRACT

A method for making an electrode over a light emissive layer in an organic light emitting device includes providing the organic light emitting device into a vacuum chamber having a receptacle for vaporizing material. Heating the receptacle to evaporate material placed in the receptacle for deposition onto the light emissive layer to form the electrode, and a shutter, which when open, permits evaporated material from the heated receptacle to deposit onto the light emissive layer. The method also includes selectively feeding an elongated member made of material to be evaporated into the heated receptacle when the electrode is to be formed and removing such material from such heated receptacle when such electrode is not to be formed.

5 Claims, 2 Drawing Sheets

METHOD OF DEPOSITING ALUMINUM-LITHIUM ALLOY CATHODE IN ORGANIC LIGHT EMITTING DEVICES

FIELD OF THE INVENTION

This invention relates to a method of depositing electroluminescent devices and more particularly to a method of forming an aluminum-lithium alloy cathode layer in such devices for improving the drive voltage and efficiency of these devices.

BACKGROUND OF THE INVENTION

Organic light emitting devices are known to be highly efficient and are capable of producing a wide range of colors. Useful applications such as flat-panel displays have been contemplated.

The most recent discoveries in the art of organic light emitting device construction have resulted in devices having the organic EL medium consisting of extremely thin layers (<1.0 micrometer in combined thickness) separating the anode and cathode. The thin organic EL medium offers reduced resistance, permitting higher current densities for a given level of electrical bias voltage. In a basic two-layer organic light emitting device structure, one organic layer is specifically chosen to inject and transport holes and the other organic layer is specifically chosen to inject and transport electrons. The interface between the two layers provides an efficient site for the recombination of the injected hole-electron pair and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006; and 5,151,629.

The simple structure can be modified to a three-layer structure, in which an additional luminescent layer is introduced between the hole and electron-transporting layers to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as high luminance efficiency. Likewise, the electron and hole transport layers can be optimized primarily for the carrier transport property.

The organic light emitting devices can be view as a diode, which is forward biased when the anode is at a higher potential than the cathode. The anode and cathode of the organic light emitting device can each take any convenient conventional form, such as any of the various forms disclosed by Tang et al. U.S. Pat. No. 4,885,211. Operating voltage can be substantially reduced when using a low work function cathode and a high work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitute one preferred cathode construction. The Al:Mg cathodes of Van Slyke et al. U.S. Pat. No. 5,059,862 are another preferred cathode construction.

Organic EL cells using low work function alloys of Al—Li as a cathode were reported by Wakimoto et al. (IEEE Transactions on Electron Devices, vol. 44, 1245 [1997]). These cells performed well in both EL emitting characteristics and the durability. However, Wakimoto et al. reported that it was difficult to maintain the optimal Li concentration in the films. Al—Li alloy was deposited by using conventional thermal evaporation. Therefore, the EL cells with Al—Li cathode having optimal concentration did not reproduce well. For the fabrication of organic light emitting devices, it is important that the thin film preparation method is reproducible for large-scale manufacturing.

To eliminate the irreproducibility of the organic light emitting devices, Wakimoto used lithium oxide/aluminum metal bi-layer cathode. The use of a LiF/Al bilayer to enhance electron injection in organic light emitting devices has also been disclosed by Hung et al. in U.S. Pat. No. 5,624,604. However, this is a two-step process and involves the use of two evaporation sources, one for LiF and other for Al. This involves significant time loss during manufacturing. If two sources are located in a single evaporation chamber, then it requires the first LiF source to be turned ON, bring it to the evaporation temperature and then deposit 0.5 nm LiF layer. Before depositing the second 200 nm Al metal layer, either the substrates having the thermal sensitive organic light emitting layers should be shielded against the radiation heat from the second Al source, or it should be transported to the other buffer chamber before the second source comes up to high temperature and is ready to reach the required Al deposition rate. If two separate chambers are used for deposition of LiF and Al layers separately, this results in significant time loss for transporting substrate from one chamber to another chamber, in addition to the cost of the second chamber.

SUMMARY OF THE INVENTION

It is an object of the present invention to provide an improved method of making organic light emitting devices, which eliminates the above non-reproducibility of the Al—Li cathode and provide high quality organic light emitting devices.

This object is achieved in a method for making an electrode over a light emissive layer in an organic light emitting device, comprising the steps of:
  a) providing the organic light emitting device into a vacuum chamber having a receptacle for vaporizing material, means for heating the receptacle to evaporate material placed in the receptacle for deposition onto the light emissive layer to form the electrode, and a shutter, which when open, permits evaporated material from the heated receptacle, to deposit onto the light emissive layer; and
  b) selectively feeding an elongated member made of material to be evaporated into the heated receptacle when the electrode is to be formed and removing such material from such heated receptacle when such electrode is not to be formed.

ADVANTAGES

The following include advantages of the present invention:
  1) Use of Al—Li alloy as a cathode decreases the organic light emitting drive voltage as compared to Mg—Ag alloy.
  2) The cathode deposition is a single-step evaporation process and uses a single evaporation source.
  3) The present invention requires less deposition time and thus short cycle time. This can also reduce the possible thermal damage to the sensitive organic light emitting organic layers.
  4) The present invention improves the production throughput for low cost manufacturing.

5) Flash evaporation deposits repeatable alloy composition for each deposition, thus minimizing variability from device to device.
6) A spool containing a thin wire up to 200 feet long can be used for preparing numerous devices. This eliminates the opening of the deposition vacuum chambers to atmospheric pressure and reduction of the down time.
7) The present invention increases the production efficiency.
8) Eliminates spitting of the alloy and the quality organic light emitting devices are prepared.
9) Reduces the materials usage.
10) Cathode deposition process has superior stability and control of the deposition flux, and very clean operation conditions.
11) Produces organic light emitting devices with Al—Li alloy cathodes with good reproducibility.

DETAILED DESCRIPTION OF THE INVENTION

Figure 1:
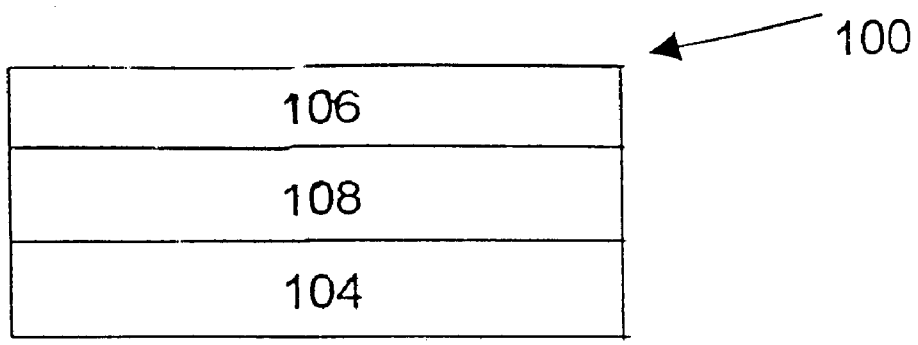
FIG. 1 is a schematic diagram of an embodiment of an electrode structure in accordance with the present invention.

The light emissive layer of the organic light emitting device comprises of a luminescent or fluorescent material where electroluminescence is produced as a result of electron-hole pair recombination in this region. In the simplest construction, as shown in FIG. 1, the organic electroluminescent layer 108, is sandwiched between anode 104 and an electrode (cathode) 106. The light emitting layer is a pure material with a high luminescent efficiency. A well known material is tris (8-quinolinato) aluminum, (Alq), which produces excellent green electroluminescence.

Figure 2:
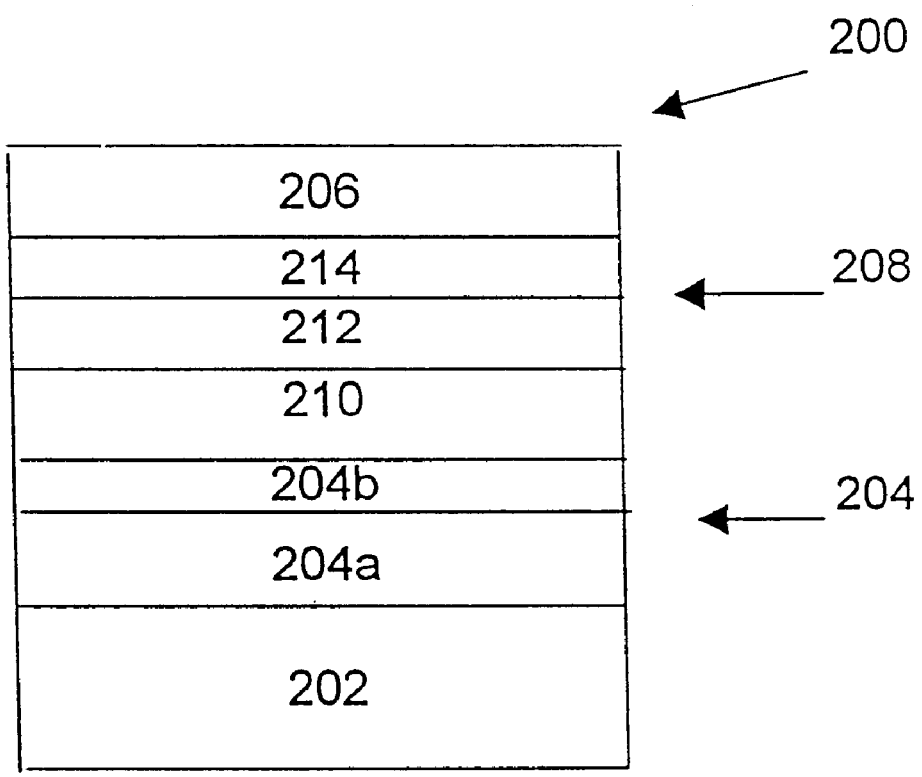
FIG. 2 is a schematic diagram of an organic electroluminescent.

The simple structure can be modified to a three-layer structure as shown in FIG. 2, in which an additional electroluminescent layer is introduced between the hole and electron-transporting layers to function primarily as the site for hole-electron recombination and thus electroluminescence.

Turning to FIG. 2, an organic light emitting device 200 has a light-transmissive substrate 202 on which is disposed a light-transmissive anode 204. The anode 204 comprises of two layers 204a and 204b. An organic light emitting structure 208 is formed between the anode 204 and a cathode 206. The organic light emitting structure 208 is comprised of, in sequence, an organic hole-transporting layer 210, a light emissive layer 212, and an organic electron-transporting layer 214. When an electrical potential difference (not shown) is applied between the anode 204 and the cathode 206, the cathode will inject electrons into the electron-transporting layer 214, and the electrons will migrate across layer 214 to the light emissive layer 212. At the same time, holes will be injected from the anode 204 into the hole-transporting layer 210. The holes will migrate across layer 210 and recombine with electrons at or near a junction formed between the hole-transporting layer 210 and the light emissive layer 212. When a migrating electron drops from its conduction band to a valance band in filling a hole, energy is released as light, and is emitted through the light-transmissive anode 204 and substrate 202.

The organic light emitting devices can be viewed as a diode, which is forward biased when the anode is at a higher potential than the cathode. The anode and cathode of the organic light emitting device can each take any convenient conventional form, such as any of the various forms disclosed by Tang et al. U.S. Pat. No. 4,885,211. Operating voltage can be substantially reduced when using a low work function cathode and a high work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,862 are another preferred cathode construction. Hung et al. in U.S. Pat. No. 5,776,622 has disclosed the use of a LiF/Al bilayer to enhanced electron injection in organic light emitting devices. Thus, although deposition of LiF/Al two-layer cathode structure is practical, it increases the manufacturing cycle time.

Conventional anodes 204a are formed of a conductive and transparent oxide. Indium tin oxide has been widely used as the anode contact because of its transparency, good conductivity, and high work function.

In a preferred embodiment, an anode 204a can be modified with a hole injection layer 204b. An example of material in such a hole injection layer are the fluorocarbons disclosed by Hung U.S. patent application Ser. No. 09/186,829 filed Nov. 5, 1998, the disclosure of which is incorporated herein by reference.

Preferred materials for use in forming the electron-transporting layer of the organic light emitting devices of this invention are metal chelated oxinoid compounds, including chelates of oxine itself (also commonly referred to as 8-quinolinol or 8-hydroxyquinoline) as disclosed in U.S. Pat. No. 4,885,211. Such compounds exhibit both high levels of performance and are readily fabricated in the form of thin layers.

The light-transmissive substrate 202 may be constructed of glass, quartz, or a plastic material. Preferred materials for use in forming the hole transport layer of the organic light emitting devices are tertiary amines as taught in Van Slyke U.S. Pat. No. 4,539,507. Another class of preferred amines is tetraaryl amines.

Typically, alloyed contacts such as Al—Li are co-evaporated either from separate sources or a single source of previously prepared alloy by placing a small amount of the material into a receptacle formed of tungsten or tantalum. The receptacle is in the form of a boat (hereinafter referred to as the boat). The boat is heated to cause a wire placed in the boat to melt and evaporate to cause the deposition of the cathode. The deposition of Al or Al—Li alloy using the conventional tungsten boat sources is difficult due to the reactive nature of these materials. Aluminum material reacts with the tungsten or tantalum boats. These sources are short lived with irreproducible flux rates and these set ups can not be used for manufacturing the organic light emitting devices. The evaporation chamber is opened frequently to load the charge and change the boats. Thus, these set ups are not suitable for low cost, and high throughput manufacturing.

Flash evaporation of Al—Li alloy wire feed system using a fine wire was used for deposition of Al—Li cathode. Flash evaporation with the wire feed system uses a fine wire as the source material and a high temperature boron-nitride boat was used to evaporate the material. The wire can be fed continuously or in pulses and evaporates on contact with the preheated ceramic boat.

Wire feed systems have been used previously for Al metallization for high throughput manufacturing of web or roll coating (I. Baxter, Society of Vacuum Coaters, the Annual Technical Conference Proceedings, 197 (1993). Flash evaporation can produce relatively thick films, as in an E-beam system, without problems with radiation damage. By using the flash evaporation wire feed system, deposition rates greater than 10 nm/second can be achieved allowing the high throughput manufacturing of organic light emitting devices.

High accuracy continuous or pulse wire feed system was used for Al and Al—Li alloy metallization. The wire is fed in pulses, which eliminates the excessive flooding of the evaporating boat and leaving almost no material in the boat after evaporation. This enhances the life of the evaporating boat. The wire also can be fed continuously with controlled feed rate, so that all the material is used for evaporation and no material is left in the boat.

Figure 3:
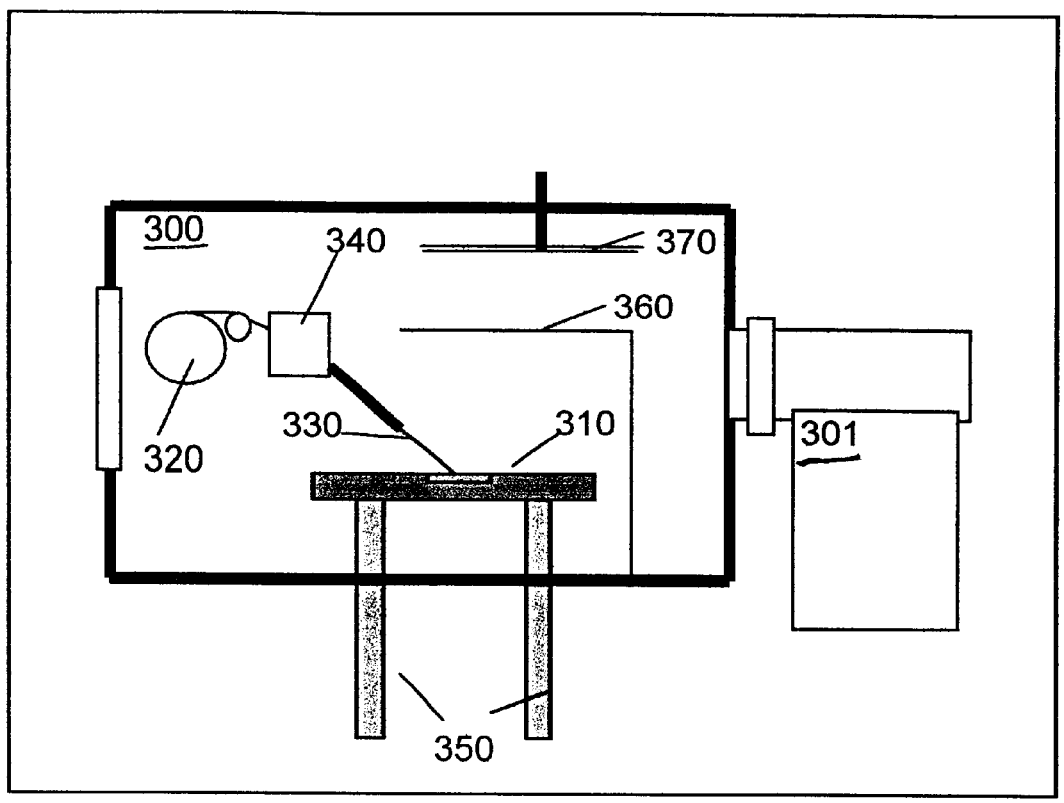
FIG. 3 is a schematic diagram of the Al—Li wire feed system for deposition of the cathode.

FIG. 3 shows the schematic of the wire feed system used for depositing Al-alloy films. It contains a vacuum chamber 300, which can be pumped down to a high vacuum on the order of $1E10^{-5}$ to $1E10^{-7}$ Torr by means of vacuum pumping system 301. The evaporation system include a ceramic boat 310 which can heated to a high temperature by means of a power supply connected to power feedthrough 350. A 100 feet long, 1.5 mm diameter wire wound on roll is mounted on the spool 320 inside the vacuum system. The Al wire feed rate is accurately controlled by servo-motor. The guiding mechanism 340 controls the wire feed 330. The evaporator boat made of boron nitride 310 is heated by a high current and low voltage supply (approximately 600 Amp and 10 volts) SER controlled AC power supply connected to feedthrough 350. A stainless steel shutter 360 is opened when the evaporation rate monitored by a separate quartz crystal sensor reaches above 1 nm/s. This allows evaporated material to deposit on the substrate 202 of the organic light emitting device which is positioned above the boat on the substrate holder 370. The substrate can be rotated for uniform deposition of the cathode material. The power to the boron-nitride boat evaporator is precisely controlled. This gives evaporation conditions, which are more stable, resulting in spit free evaporation and pin-hole free cathode films.

The deposition rate greater than 10 nm/s can be achieved using the wire feed evaporation system, thus giving a short cycle time of cathode deposition. Having achieved high deposition rates for short cycle time deposition, the effect of substrate temperature must also be taken into consideration. In general, as the rate of deposition increases with increasing power level, so does the temperature of the Al film. The film is subjected to a combination of radiant and condensation heat load as it is metallized. This could have severe influence on the growth process and give rise to changes in the structure and morphology of the film. It is, therefore, crucial to keep low metallizing temperature and minimize the substrate resident time in the electrode chamber to avoid possible damage to the sensitive organic layers. The electrical resistivity of the Al thin film has been noted to be influenced by the background chamber pressure (oxygen impurity content), deposition rate, and substrate temperature and film structure such as surface morphology and grain boundaries. For this reason, chamber base pressure of less than 1E-6 Torr and the deposition rate greater than 1 nm/s are desired.

The invention and its advantages are further illustrated by the specific examples which follow.

EXAMPLE 1

Aluminum deposition process by flash evaporation has superior stability and control of the deposition flux, and very clean operation conditions. Reproducibility of the alloy composition in the thin film from sequential depositions is demonstrated by the data shown in Table 1. It shows the composition of the evaporated alloy as compared to the initial wire composition.

Four glass substrates were loaded in the load chamber of multi-chamber vacuum system. Boron-nitride boat of the wire-feed evaporation system in the cathode deposition chamber was preheated to a temperature of about 1000–1100° C., which is above the melting, and evaporation temperature of the Al—Li alloy by applying electric power to the boat. Glass substrate was brought to the cathode deposition chamber and positioned above the boat keeping the shutter 306 closed. The alloy was fed from the spool to the heated boron-nitride boat at the rate of 2 mm/s feed and 2 sec delay time. A small amount of molten alloy puddle was created in the boat. When the evaporation rate increased to greater than 1 nm/s, the substrate was opened to deposit about 200 nm thick Al—Li alloy layer. After the deposition shutter was closed and the alloy wire was reversed and wound on the spool, the coated substrate was transferred to the load chamber for storage.

A second glass substrate was brought to the electrode chamber and was deposited with 200 nm Al—Li alloy film by following the above procedure of feeding the wire to the heated boat 310. Similarly two other substrates were coated with the 200 nm Al—Li alloy films.

The deposited alloy films and the alloy wire samples were analyzed for composition by using inductively coupled plasma (ICP) analytical technique. Table 1 shows the composition analysis for Al and Lithium. It shows that the starting alloy composition is reproduced within the variability of +/−0.2%. Also there is good reproducibility of the thin film composition within different depositions, thus demonstrating the process control of the Al—Li alloy evaporation system using the wire feed. This controlled composition deposition of the Al—Li cathode 106 should produce organic light emitting devices with reproducible EL characteristics for the purpose of manufacturing and demonstrated by the following examples.

TABLE 1

Composition Analysis of Aluminum-Lithium alloy thin films prepared by wire feed technique

| Sample ID | Aluminum atomic percent (+/−0.25) | Lithium atomic percent (+/−0.25) |
|---|---|---|
| Starting alloy composition | 95.50 | 4.50 |
| Sample 1 | 95.42 | 4.58 |
| Sample 2 | 96.10 | 3.90 |
| Sample 3 | 95.10 | 4.90 |
| Sample 4 | 95.40 | 4.60 |

EXAMPLE 2

The organic light emitting devices were deposited on glass substrates. The substrate consisted of a patterned ITO film (nominal surface resistance of 20 ohm/sq) on Corning 7050 glass. Aluminum tris 8-hydroxiquinoline (Alq) was used as the emitter layer. The thickness of the Alq or the doped emission layer was 37.5 nm. NPB layer of 75 nm or 150 nm thickness was used as the HTL layer. Full structure devices were prepared in ULVAC multi-chamber Satella UHV system (base pressure 10–6–10–7 Torr). The ULVAC system consists of seven independent chambers for loading the substrates, for ITO surface pre-treatment, for organic layer deposition, for electrode deposition and for unloading the substrates to a dry box via transfer chamber. A batch of ten 152.4 mm×152.4 mm substrates can be processed in batch-processing or in parallel-processing mode without breaking the vacuum. The substrates are transferred from station to station via a computer controlled robot.

An organic light emitting device was constructed in the following manner:

Three substrates coated with 80 nm ITO were sequentially ultrasonicated in a commercial detergent, rinsed in deionized water, degreased in toluene vapor. These substrates were treated with an oxygen plasma for about one minute and coated with 1 nm fluorocarbon layer by plasma assisted deposition of $CHF_3$.

These substrates were loaded into a deposition chamber for organic layers and cathodes were deposited.

Device A was prepared by sequential deposition of 150 nm NPB hole-transporting layer, followed by 37.5 nm Alq emission layer without any dopant (EML), and 37.5 nm Alq electron transport layer (ETL). An Al—Li alloy cathode electrode 206 (see FIG. 2) of 200 nm was deposited by flash evaporation of the alloy using the wire feed system. The above sequence completed the deposition of the organic light emitting device. The organic light emitting device was stored in an unload chamber of the vacuum chamber.

Two other devices, device B and device C were prepared by following the above process. In each case Al—Li cathode was formed by evaporation of the same alloy using the wire feed technique as described earlier. The composition of alloy wire was Al96 Li 4 atomic %. All the organic light emitting devices were transferred to the unload chamber for storage.

All the organic light emitting devices were then hermetically sealed in an encapsulation package provided on the organic light emitting device in a dry glove box filled with nitrogen for protection against ambient environment. The ITO patterned substrates used for preparing these organic light emitting devices contained several icons. Each individual icon of the organic light emitting device was tested for current voltage characteristics and the electroluminescence yield. The EL data for these devices is given in Table 2. The data shows that the organic light emitting devices are produced with consistently with similar characteristics of luminance, drive voltage and color chromaticity ($CIE_{x,y}$ coordinates).

EXAMPLE 3

Organic light emitting devices were also prepared with the same device structure as described in Example 1, except that the starting Li—Al wire of different composition was used. The starting composition of the alloy was Al 97%, Li 3%. These devices gave average drive voltage and luminance of 8.3 volts and 620 $cd/m^2$, respectively. Thus different compositions of the starting alloy wire material can be used to prepare cathode layer in the organic light emitting device. Other alloy materials such as aluminum-cesium (Ag—Li) also can be used in the form of a thin wire for preparing cathode layer by evaporating techniques of this invention.

EXAMPLE 4

Organic light emitting devices were also prepared with the same device structure as described in Example 1, except that instead the cathode was deposited first by depositing 0.5 nm LiF and then depositing 200 nm aluminum layer. Aluminum cathode was formed by evaporation of Al metal using the wire feed. These devices gave average drive voltage and luminance of 8.5 volts and 620 $cd/m^2$, respectively. Thus, the organic light emitting device performance of the organic light emitting devices fabricated by Al—Li alloy cathode evaporation of wire feed technique of this invention gave similar performance to that obtained by LiF/Al two-layer cathode used in prior art.

EXAMPLE 5

Organic light emitting devices were also prepared with the same device structure as described in Example 1, except that instead the cathode was deposited first by depositing 0.5 nm LiF and then depositing 200 nm aluminum-lithium alloy used in Example 1. These devices gave average drive voltage and luminance of 8.5 volts and 650 $cd/m^2$, respectively.

The invention has been described in detail with particular reference to certain preferred embodiments thereof, but it will be understood that variations and modifications can be effected within the spirit and scope of the invention.

PARTS LIST

100 organic light emitting device with the simple structure
104 anode layer
106 cathode contact
108 organic electroluminescent layer
200 multilayer organic light emitting device
202 transparent substrate
204 electrically conducting transparent anode
204a transparent anode layer

TABLE 2

EL characteristic of the devices using Aluminum-Lithium alloy cathode

| Device | ITO anode thickness (nm) | NPB hole transport layer thickness (nm) | Alq thickness (nm) | Aluminum Lithium alloy cathode thickness (nm) | Luminance (cd/m2) @ 20 mA/cm2 | Luminance Yield @ 20 mA/cm2 | CIEx | CIEy | Drive voltage @ 20 mA/cm2 (+/−0.2 v) |
|---|---|---|---|---|---|---|---|---|---|
| Device 1 | 75 | 150 | 75 | 200 | 670.75 | 3.35 | 0.34 | 0.54 | 8.10 |
| Device 2 | 75 | 150 | 75 | 200 | 687.5 | 3.44 | 0.34 | 0.54 | 8.00 |
| Device 3 | 75 | 150 | 75 | 200 | 680 | 3.40 | 0.34 | 0.54 | 8.50 |

204b thin fluorocarbon layer
206 cathode structure
208 organic light emitting structure
210 hole-transporting layer
212 light emissive layer
214 electron transport layer
300 vacuum chamber for electrode deposition
301 vacuum pumping system
310 boron-nitride boat for alloy evaporation
320 spool with alloy wire
330 alloy wire for feeding in the preheated boat
340 guiding control mechanism for wire feed
350 power-feed through for applying power to the boat
360 stainless steel shutter for opening and closing
370 substrate holder

What is claimed is:

1. A method for making an electrode over a light emissive layer in an organic light emitting device, comprising the steps of:

a) providing the organic light emitting device into a vacuum chamber having a receptacle for vaporizing material, means for heating the receptacle to evaporate material placed in the receptacle for deposition onto the light emissive layer to form the electrode, and a shutter, which when open, permits evaporated material from the heated receptacle, to deposit onto the light emissive layer; and b) selectively feeding an elongated member including aluminum lithium alloy to be evaporated into the heated receptacle when the electrode is to be formed and removing such material from such heated receptacle when such electrode is not to be formed.

2. The method of claim 1 wherein the receptacle is made of a ceramic material including boron-nitride.

3. The method of claim 1 wherein the elongated member is in the form of a wire.

4. The method of claim 1 wherein when the shutter is opened, the evaporated material is deposited as the electrode layer and has a thickness in a range of about 10 nm to 500 nm.

5. The method of claim 4 further including removing the organic light emitting device with the formed electrode from the vacuum chamber and providing an encapsulation seal over the organic light emitting device.

* * * * *

UNITED STATES PATENT AND TRADEMARK OFFICE
CERTIFICATE OF CORRECTION

PATENT NO. : 6,676,990 B1
DATED : January 13, 2004
INVENTOR(S) : Tukaram K. Hatwar et al.

It is certified that error appears in the above-identified patent and that said Letters Patent is hereby corrected as shown below:

Column 8,
Line 12, should read -- (Al-Cs) and silver-lithium (Ag-Li) also can be used in the form of a thin wire for --

Signed and Sealed this

Third Day of August, 2004

JON W. DUDAS
*Acting Director of the United States Patent and Trademark Office*